United States Patent
Pinto Silva et al.

(10) Patent No.: US 11,650,507 B2
(45) Date of Patent: May 16, 2023

(54) SOLVENTS AND RELATED PROCESSES FOR PRINTING PLATE MANUFACTURE

(71) Applicant: Spring Coating Systems SAS, Buhl (FR)

(72) Inventors: Fabienne Pinto Silva, Mulhouse (FR); Jean-François Bartolo, Hipsheim (FR); Geoffrey Berrez, Chemaudin et Vaux (FR); Ernest Korchak, Jungholtz (FR)

(73) Assignee: SPRING COATING SYSTEMS SAS, Buhl (FR)

( * ) Notice: Subject to any disclaimer, the term of this patent is extended or adjusted under 35 U.S.C. 154(b) by 130 days.

(21) Appl. No.: 17/184,790

(22) Filed: Feb. 25, 2021

(65) Prior Publication Data

US 2021/0263417 A1 Aug. 26, 2021

(30) Foreign Application Priority Data

Feb. 26, 2020 (EP) ..................................... 20159517

(51) Int. Cl.
*G03F 7/32* (2006.01)
*G03F 7/20* (2006.01)
*G03F 7/30* (2006.01)

(52) U.S. Cl.
CPC ............ *G03F 7/325* (2013.01); *G03F 7/2012* (2013.01); *G03F 7/3057* (2013.01); *G03F 7/3092* (2013.01)

(58) Field of Classification Search
CPC ........................................................ G03F 7/20
See application file for complete search history.

(56) References Cited

U.S. PATENT DOCUMENTS

| | | | | |
|---|---|---|---|---|
| 5,260,167 A | * | 11/1993 | Sasa ........................ | G03F 7/027 430/303 |
| 2004/0152019 A1 | | 8/2004 | Wyatt et al. | |
| 2006/0040218 A1 | | 2/2006 | Wyatt et al. | |
| 2012/0308935 A1 | | 12/2012 | Fohrenkamm et al. | |

FOREIGN PATENT DOCUMENTS

| | | | | |
|---|---|---|---|---|
| EP | 2040124 A1 | * | 3/2009 | ............. G03F 7/322 |
| EP | 2040124 A1 | | 3/2009 | |
| KR | 20180023249 A | | 3/2018 | |
| WO | 2012168485 A1 | | 12/2012 | |
| WO | WO-2012168485 A1 | * | 12/2012 | ............. C23G 5/032 |

* cited by examiner

*Primary Examiner* — Chanceity N Robinson
(74) *Attorney, Agent, or Firm* — Volpe Koenig

(57) ABSTRACT

A process for producing a flexographic relief printing plate includes using a photopolymer developing solution. This photopolymer developing solution may comprise butylal alone or butylal and one or more organic cosolvents. It may comprise DPnB and one or more cosolvents and no butylal.

17 Claims, No Drawings

SOLVENTS AND RELATED PROCESSES FOR PRINTING PLATE MANUFACTURE

CROSS REFERENCE TO RELATED APPLICATION

This application claims priority to EP20159517.0, which was filed Feb. 26, 2020 and is incorporated herein by reference as if fully set forth.

FIELD OF THE INVENTION

The present invention relates to a photopolymer developing solution for providing a flexographic relief printing form known as a photopolymer printing plate.

It relates, as well, to a process or method for producing a flexographic relief printing plate using said developing solution, and to the use of butylal and/or dipropyleneglycol-n-butylether (DPnB) in said photopolymer developing solution for providing a flexographic relief printing plate.

BACKGROUND OF THE INVENTION

Photopolymer printing plates are used to transmit the graphics image to a substrate in the flexographic printing process. Flexographic printing is one of the most prevalent printing methods.

A photopolymer plate typically consists of (i) a thin dimensionally stable backing, (ii) a layer of photopolymer made of some combination of polymers and elastomers, plasticizers, colorants etc., which are rendered photosensitive, and (iii) one or several layers on the surface which protect the plate from contact with films and/or provide a mask layer for laser engraving of the graphics and/or provide surface effects that influence ink transfer and/or plate curing. The structure of the photopolymer plate is not a limiting factor as the processing solution in the object of this invention is intended to work with essentially all photopolymer plate types.

The imaging process consists in either applying a mask layer (via a negative) to the printing side of the plate or, alternatively ablating a mask layer that is integrated to the plate surface. Other techniques exist to create a mask and are well known. The plates are cured using a known principle in which UV lamps initiate a 2-step curing process. First, a polymer layer of a targeted thickness is cured through the back support film of the plate to create the floor. The main role of the floor is to support and anchor the image areas. The second step of the imaging process involves curing the image area through the top (print side) of the plate. In addition to curing the image areas and the supporting floor, curing provides mechanical, physical and chemical resistance properties essential for the printing process. The uncured areas are then washed out using a known process including putting the plates into a processor in contact with moving or static brushes and a photopolymer developing solution, resulting in the wet plate with the engraved areas of printing intended to transmit the graphic information. The time of the wash-out cycle depends among others on the efficiency of the solvent, the brushes and their mechanical force, the type of photopolymer and its surface chemistry, the image design and overall plate thickness and relief depth. As the plate swells during the washout process, it is subsequently dried (e.g. in an oven at 60° C.) in order to bring the plate back to its nominal thickness. The appropriate drying time is a function of, inter alia, the overall plate thickness, the temperature and efficiency of the air circulation, of the photopolymer to be engraved and the aggressive nature of the solvent. Short cycle times and drying times are advantageous.

After the drying step, the plate is put through a finishing step including a final UV curing, enhancing the chemical and mechanical resistance of the plate as well as reducing the stickiness (plate tack) of the printing surface.

Formerly, solvents for processing photopolymer plates contained perchloroethylene and an alcohol. Today's standard plate solvents are so-called 3-or-more-component system ("multi-component system(s)" or "multicomponent blend(s)" or "more-than-three- or especially three-solvent system" herein-after) consisting of naphthalene-depleted or ultra-low naphthalene aromatic hydrocarbons, some kind of alcohol, and a component to reduce the odor and to further improve the environmental, safety, and health (EHS) profile of the solvent blends. These multi-component blends are, however, slower, more difficult to keep in balance, and more expensive than the preceding 2-component solutions. In addition, 2-component solutions established before the multi-component systems and consisting of aromatic hydrocarbon and some kind of alcohol were faster in engraving but stronger in odor and less safe. Both the hydrocarbon/alcohol 2-component solutions and the multi-component systems require vacuum distillation. Only the volatile perchloro solvents could be distilled without vacuum. In other words, with the growth of current multi-component solutions, the market has accepted lower productivity and higher costs in exchange for improvements in operator safety, comfort and environmental safety.

A professional engraver of photopolymer printing plates will prefer a solvent which meets many or all of the following requirements:
1. is compatible with the joints, brushes and other parts of the processor,
2. engraves the plates quickly and cleanly,
3. can be effective at an acceptable range of processing temperatures (typically 25-35° C.),
4. allows the plate to dry quickly and come back to its nominal gauge without surface defects such as "orange peel",
5. does not saturate too quickly from residual polymer,
6. keeps the processor clean of residual polymer and other plate components, such as the mask layer,
7. is easy to distill and maintain in balance over numerous cycles of platemaking and distillation,
8. is easy to correct once out of balance,
9. is easy to store and transport (preferably without restrictions) in a wide variety of ambient temperatures and in humid environments,
10. has low odor,
11. is not a fire risk and
12. meets, or preferably exceeds, regulatory standards for operator and environmental safety.

In addition, in order to allow the re-use of solvent in more than one wash-out cycles, the solvent should distill using standard vacuum distillation equipment.

Against this background, it is an object of the present invention to provide a photopolymer developing solution with improved operator safety, comfort and environmental protection while still providing the advantages of efficiency, quality and ease-of-use as well as compatibility with essentially all photopolymer plate constructions.

SUMMARY OF THE INVENTION

To achieve the above stated object, the features of claim 1 are provided according to the present invention. In particular, it is thus proposed according to the invention to achieve the stated object in a photopolymer developing solution for providing a flexographic relief printing as described at the beginning, wherein the photopolymer developing solution comprises butylal alone or a combination of butylal or DPnB and one or more organic cosolvents that are liquid at room temperature (that is, in the area of 22° C. to 25° C.).

The invention embodiments with the photopolymer developing solution comprising butylal take advantage of the fact that butylal has been shown surprisingly to work as a stand-alone plate processing solvent alone as well as in combination with other components in a multi-blend system. A further advantage is that butylal does not foam under standard processing conditions; this allows particular invention embodiments where no additional additives such as defoamers are necessary. In this way, an easier balancing of the solvent can also be achieved where no additional components are added which could interfere with measurements used to calculate the required component add-back ratios necessary to adjust the solvent after distillation. As butylal is not flammable, the addition of anti-static additives to reduce the risk of sparks leading to explosion is not required.

Another inventive embodiment relates to a mixture of the butylether DPnB preferably with one or more of the cosolvents defined below, especially with one or two or three or more of the cosolvents defined specifically below. DPnB is here included instead of butylal.

This advantageous invention embodiment provides that the photopolymer developing solution comprises DPnB (instead of butylal—combinations of butylal and DPnB already relate to the butylal based photopolymer developing solutions disclosed herein) and one organic cosolvent other than butylal that is liquid at room temperature. When the processing solvent is a two- or multi-component system, this makes it possible to reduce the "volatile organic compounds" (VOC) content where one or more other cosolvents are included. The use of DPnB, which is classified as non-dangerous and zero-VOC, is particularly recommended as a main solvent for reducing the VOC content. Indeed, DPnB can be added to a wide variety of solvents to reduce the overall VOC content of a plate solvent, and can also be used instead of butylal as in the present embodiment.

DETAILED DESCRIPTION OF THE INVENTION

Where in the following (or also above) more detailed definitions of expressions and features of any of the embodiments of the present invention are given, they can be used to replace one, more than one or all of the expressions or features in invention embodiments, thus leading to particular preferred invention embodiments.

Where the term "moreover" is used, this means that the feature(s) or expression(s) before this word are more preferred than that or those after this word.

Where "comprising" or "including" or "containing" is used, this means that the subsequent feature(s) are non-limiting, in contrast to "consisting of" which means that only the subsequently enumerated features are meant.

The terms "processing solvent", "plate solvent", unless otherwise noted, refer to the photopolymer developing solution of the present invention. Furthermore, unless otherwise indicated, all percentages for solvents of a photopolymer developing solution herein represent percent by weight (wt.-%) of the whole. Where "parts" are mentioned, this also refers to the parts by weight.

Butylal (CAS No. 2568-90-3) is Di-n-butoxymethane. It can be obtained from a number of commercial sources, for example from Lambiotte (BE) and BASF (DE).

DPnB (CAS No. 29911-28-2) is dipropyleneglycol-n-butylether, a colorless liquid with an ether-like odor. It can be obtained from a number of commercial sources, for example from "The Dow Chemical Company" under the trade name DOWANOL™ Glycol Ether.

Isopar L (CAS No. 64742-48-9) is a synthetic isoparaffinic hydrocarbon which is manufactured from a petroleum based raw material. It is commercialized by the Exxon Corporation and can be obtained in its generic form from a number of commercial sources, for example manufactured by Shell Chemical under the trade name Shellsol™.

Combinations of butylal with an alcohol may range from 10% to 90% butylal, the rest being the alcohol, for example, from 10% to 90% where an alcohol is a benzyl alcohol and from 20% to 90% where an alcohol is a 2-ethyl-hexanol.

Invention Embodiments with Butylal or with Butylal and Cosolvents (with DPnB where Included then as Cosolvent)

An advantageous embodiment according to the invention provides that the photopolymer developing solution comprises butylal as the only solvent (in case of other additives) or completely alone. When the processing solvent (with regard to the total solvent present) has a 100% concentration of butylal, it is thus possible that butylal as the only one component may be used to remove the film layer and to engrave the photopolymer without damaging the plate and degrading the image quality. A further advantage here is that butylal is not labelled as it is not flammable and non-toxic. Using the ASTM D93 closed cup standard at 1013 hPa, butylal has a flash point of 62.2° C., making it non-flammable under CLP standards. This means that it does not require any particular explosion proof security precautions during platemaking and distillation. When using butylal as the sole component of a plate processing solvent, there is no need to balance the solvent, which leads to more consistent processing and less handling related issues with other solvents. In this way it can also be achieved that inventory carrying for other raw materials may not be necessary and there are no problems of de-phasing of blend components to be expected.

In addition, a further advantage here is that butylal is easy to store and transport in a wide variety of ambient temperatures and in humid environments. Because butylal is miscible with alcohol, has a low freezing point (−52° C. at 1013 hPa), is not flammable and is not restricted for transportation, processing solutions containing it are, consequently, less costly to distribute and more likely to stay stable under a wide variety of storage conditions.

An additional advantage here is that butylal meets, and even exceeds, regulatory standards for operator and environmental safety and can be derived from up to 100% renewable resources. Compared to known hydrocarbon-based systems, a butylal-based solvent is clearly less hazardous to health and the environment. In addition, butylal can be manufactured as a 100% renewable resource when the upstream butanol component is derived from renewable resources (bio-butanol). This positions butylal as the only truly renewable platemaking solvent.

Since the butylal as a 100% solution may occasionally create orange peel on the surface of some types of photopolymer plates, its use is preferably limited to certain plate types, for example thicker plates which require longer wash out rates or special plates that are tough to wash out, or to industrial environments that favor productivity over quality.

Another advantageous embodiment according to the invention provides that the photopolymer developing solution comprises butylal and at least one organic cosolvent that is liquid at room temperature. When the processing solvent is a two- or multi-component system comprising butylal, this makes it possible to reduce the "volatile organic compounds" (VOC) content to the extent of the non-butylal component in the formulation. The use of non-classified co-solvents, especially DPnB, which is compatible with butylal and classified as non-dangerous and zero-VOC, is particularly recommended as a cosolvent for reducing the VOC content. Indeed, DPnB can be added to a wide variety of solvents to reduce the overall VOC content of a plate solvent (and can also be used instead of butylal in other invention embodiments).

An additional advantage here is that the non-butylal component can be chosen such as to specifically target the surface layer which can enhance the relative efficiency of the butylal. The invention embodiment also takes advantage of the fact that in a situation in which the butylal is more expensive than the non-butylal component, a blend may bring down the overall cost of the solvent. The effort associated with carrying inventory for two components and balancing a two-component system can be more than compensated since the equation for balancing can be calculated using only one measurement, such as refractive index or density (especially as no potentially disturbing additives such as defoamers or anti-statics are required) to determine the relative ratio of components in the distilled blend, which allows convenient control. Butylal has the advantage to allow mixing with another filler type of component such as an aromatic or especially de-aromatized hydrocarbon, an aliphatic hydrocarbon, a cyclic hydrocarbon or any other known solvent, and butylal is miscible with alcohols (which is not the case with hydrocarbons). In both cases, there is no risk of phase separation.

An advantageous embodiment according to the invention provides that the photopolymer developing solution comprises butylal and two or moreover more organic cosolvents that are liquid at room temperature, that is, especially a more than three- or especially a three-solvent system.

When the processing solvent is butylal in a three-or-more-component system falling under the latter embodiment, it can thus be made possible that yet additional properly selected non-butylal components may reduce the cost of the overall blend and further complement the polymer engraving of the butylal. In addition, the washout rates may be reduced if a particular photopolymer construction were deemed highly sensitive. Furthermore, it can be made possible to provide some kind of special functionality to the platemaking process such as surface tension properties in relation to the ink surface tension.

One common "third component" in a three-component system comprising butylal is an aromatic or de-aromatized hydrocarbon, or aliphatic hydrocarbon, or cyclic hydrocarbon, or terpene hydrocarbon, or DIPB.

A simple three-component system could be composed of, e.g., 40% butylal, 20% BzOH and 40% Isopar L with these ratios varying along a large spectrum but with the alcohol content remaining substantially between 10% and 70% and the difference of the formulation adjusted according to the cost target objectives and/or the requirements mentioned above.

In addition, butylal can be in a minority share in a multi-component system and can act as a binder and/or as a solvent booster, thus improving and fine-tuning wash-out efficiency. In this case, butylal concentration could be as low as 10% as a percentage of the photopolymer developing solution.

The cosolvent or cosolvents used in a photopolymer developing solution according to the invention are preferably selected from an alcohol, an aromatic hydrocarbon, a de-aromatized hydrocarbon or hydrocarbon mixture, an ester, an ether, or a mixture of two or more or all thereof.

The cosolvent or cosolvents may for example be selected from paraffinic hydrocarbons, isoparaffinic hydrocarbons, dearomatized hydrocarbon, terpene hydrocarbons, naphthenic hydrocarbons, diisopropylbenzene (DIPB), a glycol ether, an alcohol, and moreover selected from aliphatic esters and dibasic esters, especially DBE; or a mixture of two or moreover more or all thereof.

The cosolvent or cosolvents may for example be selected from paraffinic hydrocarbons, isoparaffinic hydrocarbons, n-butanol, a hexyl alcohol, a heptyl alcohol, an octyl alcohol, a nonyl alcohol, a decyl alcohol, 2-phenylethyl alcohol (CAS No.: 60-12-8, isopropylbenzyl alcohol, alpha-terpineol, 2-ethoxyethanol, 2-butoxyethanol, isopropyl alcohol, 2-(2-butoxyethoxy) ethanol, hexyl alcohol, heptyl alcohol, 2-ethylhexanol, substituted or unsubstituted cyclopentanol, substituted or unsubstituted cyclohexanol, especially unsubstituted cyclohexanol or methyl cyclohexanol, substituted or unsubstituted cycloheptanol, cyclopentyl substituted alcohol, cyclohexyl substituted alcohol, cycloheptyl substituted alcohol, tetrahydrofurfuryl alcohol, terpineol, a napthenic hydrocarbon, 2-ethylhexyl acetate, dipropylene glycol methyl ether, dipropyleneglycol-n-butylether (DPnB), and benzyl alcohol, and/or from a phenylethyl alcohol (a phenyl ethanol), especially 1-phenylethyl alcohol (in the R-, S- or racemic form (corresponding, in the mentioned order, to CAS No.: 1517-69-7, CAS No.: 1445-91-6 and CAS No.: 98-85-1, respectively)); and moreover (especially where swelling of a sealing material such as Viton (see below) can be tolerated or a non-swelling sealing material is used) with DBE, or a mixture of two or moreover more or all thereof.

The cosolvent or cosolvents used in a photopolymer developing solution according to the invention may for example be selected from an isoparaffin hydrocarbon, DIPB, C 10 aromatic or napthenic hydrocarbon, 2-ethylhexyl acetate, 2-ethylhexanol, benzyl alcohol, DPnB, and moreover (especially where swelling of a sealing material such as Viton (see below) can be tolerated or a non-swelling sealing material is used) DBE, or a mixture of two or more or all thereof.

The amount of the cosolvent or cosolvents to be used is or are in total from 0 or from 2 to 90% or to 80% by weight, preferably from 5 to 75% by weight, more preferably from 10 to 70% by weight, especially from 15 to 65% by weight, most preferably from 20 to 60% by weight, the rest being butylal.

The alcohol cosolvent used is preferably a benzyl alcohol or 2-ethyl-hexanol.

The alcohol cosolvent used is alternatively or in addition to the two alcohols mentioned in the last paragraph preferably a phenylethyl alcohol, especially 2-phenylethyl alcohol or 1-phenylethyl alcohol (in the R-, S- or racemic form). Where this is used as the only cosolvent, it is preferably present in an amount of 10 to 60% by weight, where it is used with one or more additional cosolvents in an amount of 5 to 15% by weight.

"Racemic", within the present disclosure, also includes other than 1:1 (mol/mol) mixtures of the R- and S-forms of 1-phenyl ethanol, especially the 1:1 mixture (the true racemate).

The non-alcohol cosolvent used in a two-component system comprising butylal is preferably DPnB.

The non-alcohol cosolvent used in a three-component system comprising butylal and an alcohol is preferably an aromatic or de-aromatized hydrocarbon, or aliphatic hydrocarbon, or cyclic hydrocarbon, or terpene hydrocarbon, or DIPB.

An advantageous embodiment according to the invention provides that the cosolvent or cosolvents to be used comprise an isoparaffin hydrocarbon, 2-ethylhexyl acetate, 2-ethylhexanol or benzyl alcohol, or 2-phenylethyl alcohol or 1-phenylethyl alcohol; or a mixture of two or three or all thereof.

The cosolvent or cosolvents used in a photopolymer developing solution comprising butylal according to the invention comprise preferably an isoparaffin hydrocarbon and benzyl alcohol.

In particular, where an alcohol is mentioned herein, this may be selected from 2-ethylhexanol, benzyl alcohol, 2-phenylethyl alcohol and 1-phenylethyl alcohol, or a mixture thereof.

The cosolvent or cosolvents used in a photopolymer developing solution comprising butylal according to the invention comprise preferably diisopropylbenzene (DIPB), benzyl alcohol and/or DPnB.

The cosolvent or cosolvents used in a photopolymer developing solution comprising butylal according to the invention comprise preferably diisopropylbenzene (DIPB) and/or DPnB.

The invention takes advantage of the fact that butylal can help keep the hydrocarbon and alcohol components in a homogeneous solution in a situation where hydrocarbon/alcohol blends tend to separate or de-phase over time. The advantage here is that this effect of butylal may become particularly pronounced (and valuable) under conditions approaching freezing or where water is present.

An advantageous embodiment according to the invention provides that the cosolvent or cosolvents to be used comprise or is DPnB. The advantage here is that DPnB has a low swelling profile on its own and in conjunction with butylal and has thus been determined to be compatible with the joints, brushes and other parts of the processor. The most common seals found in photopolymer plate processing equipment are made from an elastomer called Viton. Viton is a brand name for FKM, a synthetic rubber and fluoropolymer elastomer commonly used in O-rings, chemical-resistant gloves, and other molded or extruded goods. The name is a registered trademark of The Chemours Company. Viton fluoroelastomers are categorized under the ASTM D1418 and ISO 1629 designation of FKM.

Viton is resistant to oils, aqueous media and most other fluids. In general, low molecular weight ketones and esters will swell a vulcanizate of Viton. Amines affect Viton differently from the ketones and esters. Generally, amines will react with the polymer backbone and result in embrittlement of the vulcanizate. The elongation will drop off significantly and hardness will increase. Amines are just one kind of base. In general, strong bases such as sodium hydroxide at relatively high concentrations will degrade Viton. In summary, a basic understanding of chemistry is helpful in judging an elastomer's resistance to swelling or degradation.

The invention takes advantage of the fact that a solution of 100% butylal as well as various potential combinations of complementary additives, especially as mentioned specifically throughout the present disclosure, do not swell Viton and can therefore be used in such standard processing equipment.

Invention Embodiments with DPnB Instead of Butylal

In the alternative embodiments where DPnB is used instead of butylal, and thus not merely as a cosolvent for butylal, one, two, three or more cosolvents other than butylal may be comprised in the photopolymer solution.

An advantageous embodiment according to the invention without butylal provides that the photopolymer developing solution comprises DPnB and one organic cosolvent that is liquid at room temperature. When the processing solvent is a two- or multi-component system comprising DPnB, this makes it possible to further reduce the "volatile organic compounds" (VOC) content to the extent of any volatile component reduced in concentration. DPnB is classified as non-dangerous and zero-VOC, is particularly recommended as a solvent for reducing the VOC content. Indeed, DPnB can be added to a wide variety of solvents to reduce the overall VOC content of a plate solvent.

An additional advantage here is that the cosolvent can be chosen such as to specifically target the surface layer which can enhance the relative efficiency of the DPnB. The invention embodiment also takes advantage of the fact that in a situation in which the butylal is more expensive than the non-butylal component, DPnB may bring down the overall cost of the solvent mixture. As described above, refractive index or density (especially as no potentially disturbing additives such as defoamers or anti-statics are required) can be used to determine the relative ratio of components in the re-distilled blend, which allows convenient control. DPnB has the advantage to allow mixing with another filler type of component such as an aromatic or especially de-aromatized hydrocarbon, an aliphatic hydrocarbon, a cyclic hydrocarbon or any other known solvent, and it is miscible with alcohols (which is not the case with hydrocarbons). In both cases, there is no risk of phase separation.

An advantageous embodiment according to the invention provides that the photopolymer developing solution comprises DPnB and two or moreover more organic cosolvents (other than butylal) that are liquid at room temperature, that is, especially a more than three or in particular a three-solvent system.

When the processing solvent is DPnB in a three-or-more-component system falling under the latter embodiment, it can thus be made possible that yet additional properly selected non-butylal components in addition to the DPnB may reduce the cost of the overall blend; in addition, DPnB has been shown to reduce washout rates which may be useful where a particular photopolymer construction is deemed sensitive)—therefore the washout rates may be reduced if a particular photopolymer construction were deemed highly sensitive. Or, in the case where the plate requires deep relief, DPnB may be combined with more aggressive solvents such as DIPB in order to accelerate washout speeds. Furthermore, it can be made possible to provide some kind of special functionality to the platemaking process such as surface tension properties in relation to the ink surface tension.

One possible "third component" in a three-component system comprising DPnB is an aromatic or de-aromatized hydrocarbon, or aliphatic hydrocarbon, or cyclic hydrocarbon, or terpene hydrocarbon, or DIPB.

A simple three-component system (with the mentioned components together adding up to 100%) could be composed of, e.g., 20 to 60%, especially 40% DPnB; 10 to 40%, especially 20% BzOH; and 60 to 20%, especially 40% Isopar L or preferably 40% DIPB with these ratios varying along a large spectrum but with the alcohol content remaining substantially between 10% and 70% and the difference of the formulation adjusted according to the cost target objectives and/or the requirements mentioned above.

In addition, DPnB can be in a minority share in a multi-component system and can act as a binder and/or as a solvent modulator, thus improving and fine-tuning wash-out efficiency. In this case, DPnB concentration could be as low as 10% as a percentage of the photopolymer developing solution.

The cosolvent or cosolvents used in a photopolymer developing solution according to the embodiments of the invention with DPnB instead of butylal are preferably selected from an alcohol, an aromatic hydrocarbon, a de-aromatized hydrocarbon or hydrocarbon mixture, an ester, an ether, or a mixture of two or more or all thereof.

The cosolvent or cosolvents may for example be selected from paraffinic hydrocarbons, isoparaffinic hydrocarbons, dearomatized hydrocarbon, terpene hydrocarbons, naphthenic hydrocarbons, diisopropylbenzene (DIPB), a glycol ether, an alcohol, and moreover selected from aliphatic esters and dibasic esters, especially DBE; or a mixture of two or moreover more or all thereof.

The cosolvent or cosolvents may for example be selected from paraffinic hydrocarbons, isoparaffinic hydrocarbons, n-butanol, a hexyl alcohol, a heptyl alcohol, an octyl alcohol, a nonyl alcohol, a decyl alcohol, isopropylbenzyl alcohol, alpha-terpineol, 2-ethoxyethanol, 2-butoxyethanol, isopropyl alcohol, 2-(2-butoxyethoxy) ethanol, hexyl alcohol, heptyl alcohol, 2-ethylhexanol, substituted or unsubstituted cyclopentanol, substituted or unsubstituted cyclohexanol, especially unsubstituted cyclohexanol or methyl cyclohexanol, substituted or unsubstituted cycloheptanol, cyclopentyl substituted alcohol, cyclohexyl substituted alcohol, cycloheptyl substituted alcohol, tetrahydrofurfuryl alcohol, terpineol, a napthenic hydrocarbon, 2-ethylhexyl acetate, dipropylene glycol methyl ether and benzyl alcohol, and/or from a phenylethyl alcohol, especially 2-phenylethyl alcohol or 1-phenylethyl alcohol (in the R-, S- or racemic form (corresponding, in the mentioned order, to CAS: 1517-69-7, CAS: 1445-91-6 and CAS: 98-85-1, respectively) and moreover (especially where swelling of a sealing material such as Viton (see below) can be tolerated or a non-swelling sealing material is used) with DBE, or a mixture of two or moreover more or all thereof.

The amount of the cosolvent or cosolvents (other than butylal) to be used in the butylal-free embodiments is or are in total from 0 or from 2 to 90% or to 80% by weight, preferably from 5 to 75% by weight, more preferably from 10 to 70% by weight, especially from 15 to 65% by weight, most preferably from 20 to 60% by weight, the rest being DPnB.

The alcohol cosolvent used is preferably a benzyl alcohol or 2-ethyl-hexanol.

The alcohol cosolvent used is alternatively preferably a phenylethyl alcohol, especially 2-phenylethyl alcohol or 1-phenylethyl alcohol (in the R-, S- or racemic form, "racemic" being defined as above under the butylal embodiments). Where this is used as the only cosolvent, it is preferably present in an amount of 10 to 60% by weight, where it is used with one or more additional cosolvents in an amount of 5 to 15% by weight.

An advantageous embodiment according to the invention provides that the cosolvent or cosolvents to be used comprise an isoparaffin hydrocarbon, 2-ethylhexyl acetate, 2-ethylhexanol or benzyl alcohol, or 2-phenylethyl alcohol or 1-phenylethyl alcohol; or a mixture of two or three or all thereof.

The cosolvent or cosolvents used in a photopolymer developing solution comprising DPnB according to the invention comprise preferably an isoparaffin hydrocarbon and benzyl alcohol.

In particular, where an alcohol is mentioned as a cosolvent in an invention embodiment comprising DPnB but not butylal, in particular benzyl alcohol, this may be selected from 2-phenylethyl alcohol and 1-phenylethyl alcohol, or a mixture thereof.

The cosolvent or cosolvents used in a photopolymer developing solution comprising DPnB according to the invention comprise preferably diisopropylbenzene (DIPB), benzyl alcohol and/or DPnB.

The cosolvent or cosolvents used in a photopolymer developing solution comprising DPnB according to the invention comprise preferably diisopropylbenzene (DIPB).

The advantage of DPnB is that this solvent has a low swelling profile on its own and has thus been determined to be compatible with the joints, brushes and other parts of the processor. The most common seals found in photopolymer plate processing equipment are made from an elastomer called Viton, see the discussion above for the butylal comprising invention embodiments.

The invention takes advantage of the fact that DPnB does not swell Viton and can therefore be used in standard processing equipment.

The present invention provides, as well, a process or method for producing a flexographic relief printing plate comprising image-wise (using an appropriate masking) exposing a photosensitive resin composition and then selectively washing away non-exposed non-crosslinked portions of the photosensitive resin composition with said developing solution and optionally drying the flexographic relief printing plate to remove the residual developing solution, thus providing a relief image in a flexographic printing plate.

With the photopolymer developing solution according to the present invention, it is possible to provide a photopolymer developing solution with improved operator safety, comfort and environmental protection while still providing the advantages of efficiency, quality and ease-of-use as well as compatibility with essentially all photopolymer plate constructions.

Embodiments List—The following includes a non-limiting list of particular embodiments, and does not exclude embodiments otherwise described herein.
1. A photopolymer developing solution for providing a flexographic relief printing plate comprising:
   a. butylal alone or
   b. butylal and one or more organic cosolvents that are liquid at room temperature; or
   c. dipropyleneglycol-n-butylether (DPnB) and one or more cosolvents that are liquid at room temperature.
2. The photopolymer developing solution according to embodiment 1 comprising butylal or DPnB and an organic cosolvent, respectively, wherein the cosolvent or cosolvents are selected from an alcohol, an aromatic hydrocarbon, a de-aromatized hydrocarbon or hydrocarbon mixture, an ester, an ether, or a mixture of two or more or all thereof.

3. The photopolymer developing solution according to any one of the preceding embodiments, wherein the cosolvent or cosolvents are selected from paraffinic hydrocarbons, isoparaffinic hydrocarbons, dearomatized hydrocarbon, terpene hydrocarbons, naphthenic hydrocarbons, diisopropylbenzene (DIPB), a glycol ether, an alcohol, aliphatic esters and dibasic esters, especially DBE; or a mixture of two or more or all thereof.

4. The photopolymer developing solution according to any one of the preceding embodiments, wherein the cosolvent or cosolvents are selected from paraffinic hydrocarbons, isoparaffinic hydrocarbons, n-butanol, a hexyl alcohol, a heptyl alcohol, 2-ethylhexanol, an octyl alcohol, a nonyl alcohol, a decyl alcohol, 2-phenylethyl alcohol, 1-phenylethyl alcohol, isopropylbenzyl alcohol, alpha-terpineol, 2-ethoxyethanol, 2-butoxyethanol, isopropyl alcohol, 2-(2-butoxyethoxy)ethanol, substituted or unsubstituted cyclopentanol, substituted or unsubstituted cyclohexanol, especially unsubstituted cyclohexanol or methyl cyclohexanol, substituted or unsubstituted cycloheptanol, cyclopentyl substituted alcohol, cyclohexyl substituted alcohol, cycloheptyl substituted alcohol, tetrahydrofurfuryl alcohol, terpineol, a napthenic hydrocarbon, 2-ethylhexyl acetate, dipropylene glycol methyl ether, dipropyleneglycol-n-butylether (DPnB) and benzyl alcohol, or moreover from DBE or a mixture of two or more or all thereof.

5. The photopolymer developing solution according to any one of the preceding embodiments, wherein the cosolvent or cosolvents are selected from an isoparaffin hydrocarbon, DIPB, C 10 aromatic or napthenic hydrocarbon, 2-ethylhexyl acetate, 2-ethylhexanol, benzyl alcohol, and DBE or a mixture of two or more or all thereof.

6. The photopolymer developing solution according to any one of the preceding embodiments, wherein the cosolvent or cosolvents is or are present in an amount of in total from 0 or from 2 to 80% by weight, preferably in an amount of from 5 to 75% by weight, more preferably from 10 to 70% by weight, especially preferably from 15 to 65% by weight, most preferably from 20 to 60% by weight, the rest being butylal or DPnB.

7. The photopolymer developing solution according to any one of the preceding embodiments, wherein the cosolvent or cosolvents comprise an alcohol and an aromatic or de-aromatized hydrocarbon, or aliphatic hydrocarbon, or cyclic hydrocarbon, or terpene hydrocarbon, or DIPB.

8. The photopolymer developing solution according to any one of the preceding embodiments, wherein the cosolvent or cosolvents comprise 2-ethylhexanol and/or benzyl alcohol.

9. The photopolymer developing solution according to any one of the preceding embodiments, wherein the cosolvent or cosolvents comprise an isoparaffin hydrocarbon, 2-ethylhexanol or benzyl alcohol, or a mixture of two or all three thereof.

10. The photopolymer developing solution according to any one of the preceding embodiments, wherein the cosolvent or cosolvents comprise an isoparaffin hydrocarbon and benzyl alcohol.

11. The photopolymer developing solution according to any one of the preceding embodiments, wherein the cosolvent or cosolvents comprise diisopropylbenzene (DIPB), benzyl alcohol, 2-phenylethyl alcohol, 1-phenylethyl alcohol and/or DPnB.

12. The photopolymer developing solution according to any one of the preceding embodiments, wherein the cosolvent or cosolvents comprise diisopropylbenzene (DIPB) and/or DPnB.

13. The photopolymer developing solution according to any one of the preceding embodiments, wherein the cosolvent or cosolvents comprise DPnB.

14. A process or method for producing a flexographic relief printing plate comprising image-wise exposing a photosensitive resin composition and then selectively washing away non-exposed non-crosslinked portions of the photosensitive resin composition with a developing solution and optionally drying the flexographic relief printing plate to remove the residual developing solution, thus providing a relief image in a flexographic printing plate, characterized in that the developing solution is as defined in any one of the preceding embodiments;

optionally further comprising a step of recuperating the developing solution after the washing step such that the developing solution can be recycled; where preferably said step of recuperating is carried out by distillation or evaporation.

15. The use of butylal and/or of DPnB in a photopolymer developing solution according to any one of embodiments 1 to 13 for providing a flexographic relief printing plate; where the use preferably comprises a method according to embodiment 14.

The invention will now be illustrated in more detail using the following examples, but is not limited to these examples, although each represents a particular invention embodiment. Further exemplary embodiments result from a combination of the features of individual or a plurality of protection claims with one another and/or with individual or a plurality of features of the exemplary embodiments.

Invention Example 1

The photopolymer developing solution was prepared by using of a butylal alone (butylal 100%) or by blending it with other components (butylal with BzOH, butylal with BzOH and Isopar L, butylal with DBE, butylal with 2-EH-OH (2-ethylhexanol) and butylal with DPnB) on a weight basis in the percentages given in the following examples.

Comparative Example 1

The photopolymer developing solution was prepared as in Example 1, except for the use of solutions containing DIPB 100%, DPM 100%, DPNB 100%, Dimethyl succinate 100%, Rhodiasolv iris 100%, DIPB/benzyl alcohol/IsoparL 40/20/40, D60/benzyl alcohol/IsoparL 40/20/40, S150/benzyl alcohol/IsoparL 40/20/40, 2-EH-Ac/benzyl alcohol/IsoparL 40/20/40, on a weight basis in the percentages given in the following examples.

DPM refers to Solvenon®DPM, a dipropylene glycol methyl ether; S150 refers to an aromatic hydrocarbon Solvesso™ 150 Fluid from ExxonMobil Chemical; 2-EH-Ac refers to 2-ethyl-hexyl acetate; and D60 refers to Exxsol D60, a low odor, low aromatic hydrocarbon solvent (ExxonMobil Chemicals).

Example 2: (Including Comparison): Compatibility with the Joints, Brushes and Other Parts of the Processor (Viton-Experiment):

The most common seals found in photopolymer plate processing equipment are made from an elastomer called Viton, a synthetic rubber and fluoropolymer elastomer commonly manufactured by The Chemours Company and categorized under the ASTM D1418 and ISO 1629 designation of FKM (a family of fluoroelastomer materials). It is generally recognized that a solvent will be compatible with the equipment if it does not swell Viton.

Sections of Viton seals, weighing between 3.5-4 grams, were submerged in a solution of 100% butylal as well as various potential combinations of complementary solvents. Their weight before and after was compared as was the physical resistance (manual stretching as a proxy measure for tensile strength). An acceptable level of swelling is considered less than <1%, with preference of less than 0.5%.

Exhibit 1: VITON Swell Evaluation

| Solutions | Initial Weight (g) | Final Weight (g) | Δ (g) | Δ (%) | Test Length |
|---|---|---|---|---|---|
| Butylal 100% | 3.4850 | 3.4997 | 0.0147 | 0.422% | 7 days |
| DIPB 100% | 3.6734 | 3.6929 | 0.0195 | 0.531% | |
| Butylal/Bz-OH 80/20 | 3.7862 | 3.8088 | 0.0226 | 0.597% | |
| Butylal/Bz-OH/IsoparL 40/20 | 3.3681 | 3.3767 | 0.0086 | 0.255% | |
| Butylal/DBE 60/40 | 3.6955 | 5.4479 | 1.7524 | 47.420% | |
| Butylal/DPnB 60/40 | 3.5468 | 3.5643 | 0.0175 | 0.493% | |
| BPM 100% | 3.3237 | 4.5743 | 1.2506 | 37.627% | |
| DPNB 100% | 3.5071 | 3.5261 | 0.0190 | 0.542% | 1 day |
| Dimethyl succinate 100% | 3.0086 | 3.9871 | 0.9785 | 32.523% | |
| Rhodiasolv iris 100% | 3.8266 | 4.6219 | 0.7953 | 20.783% | |

The Butylal Viton swell tests compare favorably with 100% DIPB. It can be seen that the Viton seals have acceptable swelling levels with the notable exceptions of butylal and DBE mixtures, DPM, dimethyl succinate and Rhodiasolv iris where more than 0.6% swelling were observed (see Exhibit 1). DPnB does not swell Viton.

Example 3: Quick and Clean Engraving

Plates from various suppliers and at different thicknesses were engraved in various combinations of plate solvents (see Exhibit 2).

Exhibit 2: Lab Machine Processing

| | Manufacturer Kodak wash out rate (mm./min) | Product NX time to nominal thickness (minutes at 60° C.) | Thickness 1.70 mm. Image | Manufacturer Asahi wash out rate (mm./min) | Product DSF time to nominal thickness (minutes at 600° C.) | Thickness 1.70 mm. Image |
|---|---|---|---|---|---|---|
| Butylal pur | 100% | 0.949 | 60 | slight orange peel | 1.003 | 60 | slight orange peel |
| Butylal/Bz-OH | 80/20 | 0.799 | 60 | Good | 0.865 | 60 | Good |
| Butylal/2-EH-OH | 80/20 | 0.864 | 60 | Good | 0.831 | 60 | Good |
| Butylal/Bz-OH/IsoparL | 60/20/20 | 0.795 | 60 | Good | 0.779 | 60 | Good |
| Butylal/Bz-OH/IsoparL | 40/20/40 | 0.746 | 60 | Good | 0.727 | 60 | Good |
| DIPB/Bz-OH/Isopar L | 40/20/40 | 0.711 | 60 | Good | 0.650 | 60 | Good |
| D60/Bz-OH/Isopar L | 40/20/40 | 0.310 | 60 | Good | 0.155 | 60 | Good |
| S150/Bz-OH/Isopar L | 40/20/40 | 0.750 | 60 | Good | 0.725 | 60 | Good |
| 2-EH-Ac/Bz-OH/Isopar L | 40/20/40 | 0.503 | 60 | Good | 0.462 | 60 | Good |
| DIPB | 100% | 0.860 | 60 | slight orange peel | 0.884 | 60 | slight orange peel |
| Butylal/DPnB | 60/40 | 0.715 | 60 | Good | 0.663 | 60 | Good |

It can be seen that the wash out rates for butylal alone and in the combinations, butylal with 2-EH-OH, two variants of butylal with BzOH and Isopar L, and a variant of butylal with DPnB according to the invention are equivalent or faster than for known solvents which are considered state of the art.

The data for Exhibit 2 were produced on a homemade lab machine in which a rotary brush is attached to a precision drill press and the plates are fixed to a surface and covered with solvent. The brush is brought into a defined degree of contact with the plate surface (90° for these experiments) and rotated at a pre-set speed 110 revolutions per minute for a given time (2 minutes at a solvent temperature of 30° C. for the experiments). The mask layer of 1.70 mm plates from two manufacturers (format 20×20 mm.) were manually removed along the borders of the plate with a solution of 100% benzyl alcohol for all plates, leaving a masked area of 10×10 mm in the center of the plate with unmasked regions of 5 mm along the perimeters.

The plates were then exposed for 5 minutes in a Polimero plate processing system equipped with UV lamps (Philips TL60/10R with a peak intensity at 370 nm) for the imaging so that the borders were fully cured and the mask layer in the middle remained uncured. No back exposure was made so that the wash out rate would be measured on purely uncured polymer. The plates were washed out for two minutes in a 30° C. solution and then dried for one hour, after which the following measurements were made:
  relief depth (difference between washed out mask area and the border) which was then converted into a wash rate (mm./minute), measured with a digital Micrometer IP65 manufactured by Mitutoyo;
  all plates had returned to their nominal thickness of 1.70 mm in the cured border areas, measured with a digital Micrometer IP65 manufactured by Mitutoyo;

The cured surface areas were visually inspected for any quality issues.

It was noted that there was some formation of orange peel on the surface of the plates washed out with the 100% (pure) versions of butylal and DIPB. This would indicate that both solvents may be too active in their pure state for many plate types (particularly thin plates as in this experiment). On the other hand, this opens the possibility of increasing the dosage of the active ingredient (butylal) in order to increase wash-out rates when this is considered desirable, such as with thick plates >3.90 mm.

Furthermore, it was demonstrated that butylal is effective at an acceptable range of processing temperatures (typically 25-35° C.). Plates were processed at temperatures of 20° C., 25° C., 30° C. (as shown) and 35° C. The typical increase of wash rate correlated to increases in solvent temperature can be observed. The faster wash out rate of butylal means that a platemaker could, out of concern for energy conservation, reduce the temperature of the processor without sacrificing plate through-put.

Example 4: Test of Various Solvents in a Large Industrial Processor

In order to pursue the notion of plate wash out rates and the resulting plate quality, we tested various solvents in a large industrial processor (see Exhibit 3). The processor is equipped with an ESKO large format laser for ablating the mask layer (creating the image) and a Vianord Evo-5 in-line plate processing system.

Two different plate thicknesses were compared (5.50 mm and 1.70 mm). The mask ablation, exposure and light finishing times were kept constant for each plate type and the plates were produced so as to achieve target relief depths of 2.0 mm and 1.0 mm for, respectively, 5.50- and 1.70-mm plates.

For reasons of productivity, only four solvent types were tested (see Exhibit 3=Table):

butylal at 100%, a variant of DIPB with BzOH and Isopar L (the classic state of the art three-component cocktail), a variant of butylal with BzOH and Isopar L, and butylal and DPnB for a low-VOC, non-restricted version.

The results clearly indicate that 100% butylal is a faster solvent than a typical blended solvent and that butylal boosts wash-out rates in blended solvents compared to an alternative active ingredient such as DIPB. In addition, solvents containing butylal demonstrated shorter drying times. In an industrial platemaking environment, it is typically the drying step that dictates overall plate through-put and this roughly 10% increase in drying rate translates into 10% higher theoretical plate through-put.

DPnB demonstrated that it is a valid solvent for the platemaker interested in going with a low toxicity, low-VOC solution. It was noted, too, that the version D with DPnB had the lowest odor of the four solvents.

Exhibit 3: Industrial Processing

| Solvent | Plate Type Manufacture | Format Product | Target Relief Thickness | (cm) | (mm) | Back Exposure (seconds) |
|---|---|---|---|---|---|---|
| A | Dupont | DRC | 5.50 | 90 × 120 | 2.00 | 70 |
| A | Flint | ACE | 1.70 | 90 × 120 | 1.00 | 25 |
| B | Dupont | DRC | 5.50 | 90 × 120 | 2.00 | 70 |
| B | Flint | ACE | 1.70 | 90 × 120 | 1.00 | 25 |
| C | Dupont | DRC | 5.50 | 90 × 120 | 2.00 | 70 |
| C | Flint | ACE | 1.70 | 90 × 120 | 1.00 | 25 |
| D | Dupont | DRC | 5.50 | 90 × 120 | 2.00 | 70 |
| D | Flint | ACE | 1.70 | 90 × 120 | 1.00 | 25 |

| Solvent | Mask Ablation (minutes) | Main Exposure (seconds) | Washout (minutes) | Drying mins. @ 60° C. | Light finishing UV-A + UV-C (minutes) | Image Quality |
|---|---|---|---|---|---|---|
| A | 25 | 700 | 14 | 100 | 9 | Good |
| A | 25 | 750 | 6 | 80 | 12 | Good |
| B | 25 | 700 | 18 | 110 | 9 | Good |
| B | 25 | 750 | 7 | 85 | 12 | Good |
| C | 25 | 700 | 21 | 120 | 9 | Good |
| C | 25 | 750 | 9 | 90 | 12 | Good |
| D | 25 | 700 | 21 | 120 | 9 | Good |
| D | 25 | 750 | 9 | 90 | 12 | Good |

| Laser | ESKO |
|---|---|
| Processor | Vianord Evo 5 |

| Formula | Butylal | BzOH | Isopar L | DIPB | DPnB |
|---|---|---|---|---|---|
| A | 100% | | | | |
| B | 40% | 20% | 40% | | |
| C | | 20% | 40% | 40% | |
| D | 60% | | | | 40% |

Example 5: (a) Butylal is Miscible with Alcohols and, Once Out of Balance, Adjustment of the Component Shares is Easy to Perform; (b) DPnB is Useful to Avoid Phase Separation in Solvent Mixtures Instead of Butylal (a) A common problem with current systems is a de-phasing of the alcohol and hydrocarbon layers due to their mutual incompatibility. This occurs frequently when temperatures approach zero/drop below 10° C. (during storage or transport) and where the water content in the solvent reaches levels of 0.5%-1%.

As a solvent de-phases, the product that is distributed to the plate surface is, by definition, out of balance; either alcohol-heavy or hydrocarbon-heavy. This, of course, has consequences for the resulting plate quality. Removing water from distillate is very tricky and beyond the capabilities of the average professional platemaker.

While lack of miscibility can create problems in platemaking, it also complicates balancing since balancing requires taking a sample of the distilled solvent for analysis. Taking a sample from a de-phased solvent is difficult at best, even when the solution is being stirred to bring the components together. One sample is likely to, again, be alcohol-heavy or hydrocarbon-heavy in the measurement, which leads to poor adjustment of the solution. This will have an impact on plate quality and represents a waste of solvent.

Because butylal is miscible with alcohol, these problems are, quite simply, eliminated (see Exhibit 4=Table; shares of solvents are given as parts by weight).

Exhibit 4: De-phasing of solvent in presence of water

| Solutions | quantity of water (by weight) before dephasing |
|---|---|
| Butylal/Bz-OH 80/20 | 2.40% |
| Butylal/Bz-OH/isoparL 40/20/40 | 2.80% |
| Butylal/2-EH-OH 60/40 | 3.40% |
| Butylal/DPnB 60/40 | 2.20% |
| DIPB/Bz-OH /isoparL 40/20/40 | 0.90% |

Temperature: RT ≈ 22-23° C.
Volume solution: 100 mL (b) All tests were performed at a controlled temperature of 22° C. A comparison was made with an incompatible mixture of 1 part benzyl alcohol with 2 parts Isopar L. To this solution, DIPB was added which is known to be effective in keeping the alcohol and hydrocarbon elements in homogenous solution. It turned out that 1.25 parts of DIPB were required to the 1:2 benzyl alcohol/Isopar L blend.

The test was repeated for both butylal and DPnB instead of DIPB. In both cases, only 0.75 parts of either was required to bring the blend into a homogenous solution. Therefore, both of butylal and DPnB are effective, in fact, more effective than the best state of the art option.

Under the conditions of exhibit 4, the quantity of water required for dephasing turned out to be 3.2% in a solution with DPnB of the following composition: DPNB/benzyl alcohol/Isopar L=40/20/40.

Example 6: Butylal is Easy to Distill and Maintain in Balance Over Numerous Cycles of Platemaking and Distillation We set up a lab distillation unit and measured the ability to distill at temperatures and vacuum pressures consistent with conventional industrial vacuum distillation units on the market (Renzmann, IST etc).

Samples of fresh solvent were distilled over 5 cycles and measured in a mass Gas Chromatograph unit. A solution of dibutoxymethane (50 mL) and di(propylene glycol) butyl ether (50 mL) is heated to 160° C. under vacuum. The vapors are condensed and collected in a container until the solution has completely evaporated. The condensed product is reheated and the operation is repeated five times to determine the stability of the solution during regeneration cycles by distillation. Samples are collected before the first distillation cycle and after the 5th cycle. Each sample is analyzed using liquid chromatography with flame ionization detection in order to establish the continuity of proportions for each constituent of the mixture as well as the absence of secondary product formation. By the relative peak intensities, it could be confirmed that the ratios of the solvents did not change.

Example 7: Butylal as a 100% Solution, 2-Component or 3-Component Blend does not Saturate Quickly from Residual Polymer Processors use viscosity measurements to track the saturation of the solvent in order to determine replenishment rates. A solvent that saturates quickly will require more frequent replenishment, which creates waste and increases the charge on the distillation unit responsible for recycling saturated solvent.

Example 8: Butylal Helps Keep the Processor Clean of Residual Polymer and Other Plate Components, Such as the Digital Laser Mask Layer Until now, DIPB has been uniquely capable of "auto-cleaning" the inner walls and brushes of processors. Other solvents based on hydrocarbon/alcohol blends or, worse still, perchlorethylene/butanol allow polymer residues and particles of the black mask to build up over time.

A dirty processor has direct consequences on plate quality and processor brush life. Brushes saturated with polymer are less effective. The rinse brush, which is isolated in order to apply only clean solvent at the last stage, can become contaminated by "carry-over" polymer from the processor. When this happens in an image area, the plate must be rejected. Worse still, when the transfer to the surface is not noticed, the plate is placed in the dryer for over an hour, finished and then, finally, inspected prior to printing. Small amounts of polymer on the surface can be hard to detect but will influence ink transfer on the print.

We devised an experiment to estimate the ability of a solvent to keep residual polymer from building up which involve "painting" a layer of saturated polymer on a stainless steel surface (similar to the wall of a plate processor) and drying it with a hair dryer. Fresh solvent is used to wipe the surface clean and the results are compared.

Example 9: Butylal has a Low Perceived Odor

While odor is subjective and could be considered a detail among the many technical requirements for a processing solvent, the question of odor and operator comfort is an important criteria, all the same, in the selection of a processing solution.

Even where room and equipment ventilation is technically adequate, operators are exposed to the solvent throughout their working day. The odors due to the solvent also can make their way into the surrounding offices and outdoors through the extraction system. Butylal has a smell that has been described as "floral". In order to determine whether the smell would be likely to be accepted, we assembled a panel of individuals and submitted samples of current solvents on the market compared to the butylal solutions (see Exhibit 6).

| Exhibit 6: Comparative Odor Ranking | |
| --- | --- |
| Solvesso 150 | 4 |
| 2-ethyl-hexyl acetate | 3 |
| Di-isopropyl benzene | 3 |
| Butylal | 2 |
| D60 | 2 |
| Mixture Butylal/DPnB 50/50 | 1 |

Ranking: 5 = highly disagreeable; 1 = neutral

It should be noted that, while butylal was among the least offensive odors measured, the "winner" was a combination of butylal and DPnB. It would seem the DPnB reduces the perception of overall odor in a solvent blend.

Generally speaking, it is proposed to provide a photopolymer developing solution for providing a flexographic relief printing plate. This photopolymer developing solution comprises butylal or DPnB alone or both in combination, in the absence or presence of one or more further organic cosolvents that are liquid at room temperature.

The invention claimed is:

1. A process for producing a flexographic relief printing plate comprising image-wise exposing a photosensitive resin composition and then selectively washing away non-exposed non-crosslinked portions of the photosensitive resin composition with a developing solution, wherein the developing solution is a photopolymer developing solution comprising:
   a. butylal alone or
   b. butylal and one or more organic cosolvents that are liquid at room temperature; or
   c. dipropyleneglycol-n-butylether (DPnB) and one or more cosolvents that are liquid at room temperature.

2. The process according to claim 1, wherein the photopolymer developing solution comprises butylal or DPnB and the one or more organic cosolvents, respectively, wherein the one or more cosolvents are selected from an alcohol, an aromatic hydrocarbon, a de-aromatized hydrocarbon or hydrocarbon mixture, an ester, an ether, or a mixture of two or more thereof.

3. The process according to claim 1, wherein the photopolymer developing solution comprises the one or more cosolvents and the one or more cosolvents are selected from paraffinic hydrocarbons, isoparaffinic hydrocarbons, dearomatized hydrocarbon, terpene hydrocarbons, naphthenic hydrocarbons, diisopropylbenzene (DIPB), a glycol ether, an alcohol, aliphatic esters and dibasic esters (DBE); or a mixture of two or more thereof.

4. The process according to claim 1, wherein the photopolymer developing solution comprises the one or more cosolvents and the one or more cosolvents are selected from paraffinic hydrocarbons, isoparaffinic hydrocarbons, n-butanol, a hexyl alcohol, a heptyl alcohol, 2-ethylhexanol, an octyl alcohol, a nonyl alcohol, a decyl alcohol, 2-phenylethyl alcohol, 1-phenylethyl alcohol, isopropylbenzyl alcohol, alpha-terpineol, 2-ethoxyethanol, 2-butoxyethanol, isopropyl alcohol, 2-(2-butoxyethoxy) ethanol, substituted or unsubstituted cyclopentanol, substituted or unsubstituted cyclohexanol, substituted or unsubstituted cycloheptanol, cyclopentyl substituted alcohol, cyclohexyl substituted alcohol, cycloheptyl substituted alcohol, tetrahydrofurfuryl alcohol, terpineol, a napthenic hydrocarbon, 2-ethylhexyl acetate, dipropylene glycol methyl ether, dipropyleneglycol-n-butylether (DPnB), benzyl alcohol, and from dibasic esters (DBE) or a mixture of two or more thereof.

5. The process according to claim 1, wherein the photopolymer developing comprises the one or more cosolvents and the one or more cosolvents are selected from an isoparaffin hydrocarbon, diisopropylbenzene (DIPB), C 10 aromatic or napthenic hydrocarbon, 2-ethylhexyl acetate, 2-ethylhexanol, benzyl alcohol, and dibasic esters (DBE) or a mixture of two or more thereof.

6. The process according to claim 1, wherein the photopolymer developing solution comprises the one or more cosolvents in an amount of in total from 0 or from 2 to 80% by weight, the rest being butylal or DPnB.

7. The process according to claim 1, wherein the photopolymer developing solution comprises the one or more cosolvents and the one or more cosolvents comprise an alcohol and an aromatic or de-aromatized hydrocarbon, or aliphatic hydrocarbon, or cyclic hydrocarbon, or terpene hydrocarbon, or diisopropylbenzene (DIPB).

8. The process according to claim 1, wherein the photopolymer developing solution comprises the one or more cosolvents and the one or more cosolvents comprise 2-ethylhexanol and/or benzyl alcohol.

9. The process according to claim 1, wherein the photopolymer developing solution comprises the one or more cosolvents and the one or more cosolvents comprise an isoparaffin hydrocarbon, 2-ethylhexanol or benzyl alcohol, or a mixture of two or more thereof.

10. The process according to claim 1, wherein the photopolymer developing solution comprises the one or more cosolvents and the one or more cosolvents comprise an isoparaffin hydrocarbon and benzyl alcohol.

11. The process according to claim 1, wherein the photopolymer developing solution comprises the one or more cosolvents and the one or more cosolvents comprise diisopropylbenzene (DIPB), benzyl alcohol, 2-phenylethyl alcohol, 1-phenylethyl alcohol and/or DPnB.

12. The process according to claim 1, wherein the photopolymer developing solution comprises the one or more cosolvents and the one or more cosolvents comprise diisopropylbenzene (DIPB) and/or DPnB.

13. The process according to claim 1, wherein the photopolymer developing solution comprises the one or more cosolvents and the one or more cosolvents comprise DPnB.

14. The process according to claim 1,
   further comprising a step of recuperating the developing solution after the washing step such that the developing solution can be recycled.

15. The process according to claim 14, wherein the step of recuperating is carried out by distillation or evaporation.

16. The process according to claim 1, wherein the photopolymer developing solution comprises:
   a. butylal alone or
   b. butylal and one or more organic cosolvents that are liquid at room temperature.

17. The process according to claim 1 further comprising drying the flexographic relief printing plate to remove the residual developing solution.

\* \* \* \* \*